United States Patent [19]

Voigt

[11] Patent Number: 4,625,397
[45] Date of Patent: Dec. 2, 1986

[54] PLUG-IN AND PULLING TOOL

[75] Inventor: Ulrich Voigt, Munich, Fed. Rep. of Germany

[73] Assignee: Siemens Aktiengesellschaft, Berlin & Munich, Fed. Rep. of Germany

[21] Appl. No.: 730,567

[22] Filed: May 6, 1985

[30] Foreign Application Priority Data

Jul. 12, 1984 [DE] Fed. Rep. of Germany ... 8420924[U]

[51] Int. Cl.⁴ ............................................. B23P 19/00
[52] U.S. Cl. ...................................... 29/739; 29/278; 29/750
[58] Field of Search ................. 29/739, 740, 741, 750, 29/758, 762, 764, 270, 278, 281.6, 747, 252; 81/488

[56] References Cited

U.S. PATENT DOCUMENTS 3,588,983  6/1971  Hoy ...................................... 29/278
3,995,363  12/1976  Medina, Jr. ............................ 29/750

FOREIGN PATENT DOCUMENTS 2064411  6/1981  United Kingdom ................... 29/252

*Primary Examiner*—Mark Rosenbaum
*Assistant Examiner*—Carl J. Arbes
*Attorney, Agent, or Firm*—Hill, Van Santen, Steadman & Simpson

[57] ABSTRACT

The invention relates to a plug-in and pulling tool for the purpose of plugging-in or pulling an uppermost printed circuit board in a printed conductor stack which is formed through a combination of printed circuit boards, provided on the upper and lower side with one-half each of two-part plug-in connections, whereby each printed circuit board contains a keyhole-shaped recess on both lateral sides of the plug-in connector halves. The plug-in and pulling tool consists of a hollow cylindrical exterior part with a surrounding groove, corresponding to a printed circuit board thickness, formed at a height less than a printed circuit board spacing, and a push rod, whose push rod bar is guided in a mobile fashion in the interior of the hollow cylindrical exterior part in the direction of the longitudinal axis, and whose push rod plate corresponds in its diameter to the outer diameter of the exterior part.

4 Claims, 4 Drawing Figures

PLUG-IN AND PULLING TOOL

BACKGROUND OF THE INVENTION

Field of the Invention

The invention relates to a plug-in and pulling tool for the purpose of plugging-in or unplugging by pulling, an uppermost printed circuit board in a printed circuit board stack.

SUMMARY OF THE INVENTION

It is an object of the present invention to provide a plug-in and pulling tool for the purpose of plugging-in and removing an uppermost printed circuit board provided on the upper and lower side opposed with two-part plug-in connectors.

In order to achieve this objective, in accordance with the invention, the plug-in and pulling tool is formed by a hollow-cylindrical exterior part with a surrounding groove corresponding to a printed circuit board thickness, formed at a height less than a printed circuit board spacing, and a push rod whose push rod bar is guided in a mobile fashion in the interior of the hollow cylindrical exterior part in the direction of the longitudinal axis and whose push rod plate corresponds in its diameter to the outer diameter of the exterior part.

Through these measures one obtains a simply designed plug-in and pulling tool for uppermost printed circuit boards of a printed circuit board stack.

BRIEF DESCRIPTION OF THE DRAWINGS

On the basis of the sample embodiments according to FIGS. 1 through 4, the invention shall be explained in greater detail.

DESCRIPTION OF THE PREFERRED EMBODIMENTS

Figure 1:
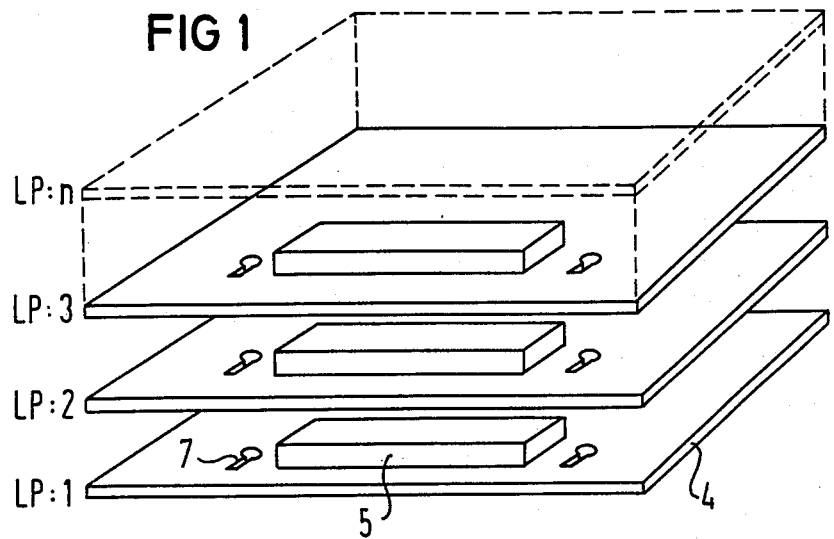
FIG. 1 shows a printed circuit board stack in a perspective illustration.
Figure 2:
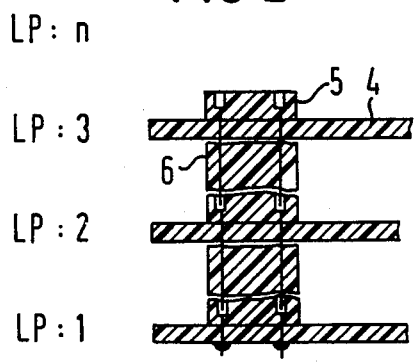
FIG. 2 shows the lateral view of a printed circuit board stack.

In FIG. 1, a stack consisting of several printed circuit boards 4 is shown, whereby the printed circuit boards are interconnected via combined plug-in connectors 5, 6. To the left and to the right adjacent the plug-in connector parts, there is disposed a keyhole-shaped recess 7. The sectional view of the circuit boards in FIG. 2 shows the mating of the two parts 5 and 6 of the two-sided but combined plug-in connector. Via said plug-in connector, the individual printed circuit boards are interconnected in a serial and stacked fashion.

Figure 3:
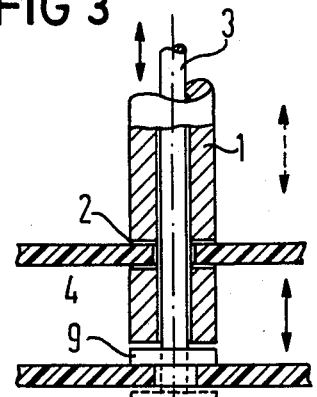
FIG. 3 shows the pulling and plug-in tool in the operating state.

With the aid of a plug-in and pulling tool, such as is shown in use in FIG. 3, the uppermost printed circuit board is placed on the stack or removed from the latter. The plug-in tool consists of a hollow-cylindrical exterior part 1, in which a push rod, consisting of a push rod bar 3 and a connected push rod plate 9, is guided in axial direction. The diameter of the push rod plate 9 is equal in size to the outer diameter of the hollow cylindrical exterior part 1. The exterior part 1 has a surrounding groove 2 formed on the exterior side thereof which is spaced from a bottom end of the exterior part less than the spacing between adjacent stacked circuit boards.

The tool movement cycle for plugging a circuit board is such that first the cylindrical exterior part, together with the push rod plate 9, is inserted through the circular opening of the keyhole-shaped recess 7 to such an extent until the groove 2, lies at the level of the uppermost circuit board. The push rod bar 3 is pushed downwardly until the push rod plate 9 is positioned below the next downwardly adjacent circuit board. Then the tool is guided through the groove by being horizontally displaced.

The push rod bar 3 is then held with upward pressure so that the push rod plate, which is now captured below the next adjacent circuit board, supports that board and the cylindrical exterior part is pushed downwardly thereby effecting a squeezing force between the two boards causing the two connector parts 5 and 6 to securely engage. Thus, the insertion force is controlled and is localized preventing damage to other circuit boards. Subsequently, the tool is pushed back horizontally from the slit-shaped termination of the keyhole-shaped recess into the circular opening and can then again be removed from the printed circuit board.

The tool movement cycle for unplugging a circuit board is such that first the cylindrical exterior part, together with the push rod plate 9, is inserted through the circular opening of the keyhole-shaped recess 7 to such an extent until the groove 2, lies at the level of the uppermost circuit board. The push rod bars 3 is held upwardly to keep the push rod plate 9 above the next downwardly adjacent circuit board. Then the tool is guided through the groove by being horizontally displaced. The push rod bar 3 is then pushed downwardly so that the push rod plate 9 engages the top surface of the adjacent circuit board and the cylindrical exterior part 1 is pulled upwardly thus causing the two adjacent circuit boards to separate. The removal force is controlled and is directed between the top two circuit boards thereby preventing unwanted separation at other circuit board locations.

Figure 4:
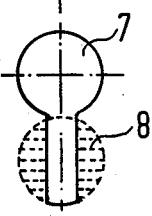
FIG. 4 shows the passage openings disposed on the printed circuit boards.

A keyhole-shaped recess 7 is illustrated in FIG. 4. It consists of a circular opening 7, which is connected with a slit-shaped extension 7b. In this slit-shaped extension the exterior part of the plug-in and pulling tool is guided and supported through the groove 2 (FIG. 3).

As is apparent from the foregoing specification, the invention is susceptible of being embodied with various alterations and modifications which may differ particularly from those that have been described in the preceeding specification and description. It should be understood that I wish to embody within the scope of the patent warranted hereon all such modifications as reasonably and properly come within the scope of my contribution to the art.

I claim as my invention:

1. A plug-in and pulling tool for the purpose of plugging-in or pulling an uppermost printed circuit board in a printed circuit board stack, which is formed through a combination of printed circuit boards spaced a predetermined distance apart, provided on the upper and lower side with one half each of a two-part plug-in connector, whereby each printed circuit board has a common predetermined thickness and contains a keyhole-shaped recess comprising a circular opening with a short connecting slot on both lateral sides of the plug-in connector halves, comprising:

a hollow cylindrical exterior part with a surrounding groove having a width corresponding to one printed circuit board thickness and formed at a height from one end of said part less than said printed circuit board spacing, and a push rod with a push rod bar guided in a mobile fashion in the interior of the hollow cylindrical exterior part in the direction of the longitudinal axis, and with a push rod plate corresponding in its diameter to the outer diameter of the exterior part, the diameter of said exterior part and psaid rod plate are slightly smaller than said circular opening of said keyhole-shaped recess, but larger than the width of said short connecting slot, whereby, said push rod plate and said groove are insertable into said openings and positionable at said slots by lateral movement to be operable against adjacent circuit boards to squeeze said circuit boards together during a plugging-in operation and to push said adjacent circuit boards apart during a pulling operation.

2. A tool according to claim 1 wherein a free end of said push rod bar extends beyond an end of said cylindrical exterior part.

3. A plug-in and pulling tool for the purpose of plugging-in an uppermost printed circuit board in a printed circuit board stack, which is formed through a combination of printed circuit boards spaced a predetermined distance apart, provided on the upper and lower side with one half each of a two-part plug-in connector, whereby each printed circuit board has a common predetermined thickness and contains a keyhole-shaped recess comprising a circular opening with a short connecting slot on both lateral sides of the plug-in connector halves, comprising:

a hollow cylindrical exterior part with a surrounding groove corresponding in width to one printed circuit board thickness and formed at a distance less than said printed circuit board spacing from an end of said part, said groove being perpendicular to the longitudinal axis of said part, and a push rod comprising a push rod bar movably guided in the interior of said hollow cylindrical exterior part in the direction of said longitudinal axis and having a free end extending beyond an end of said exterior part and an opposite end having a push rod plate formed thereon, said push rod plate corresponding in its diameter to the outer diameter of the exterior part, the diameter of said exterior part and said rod plate being slightly smaller than said circular opening of said keyhole-shaped recess, but larger than the width of said short connecting slot, whereby, said push rod plate and said groove are insertable into said openings and positionable at said slots by lateral movement to be operable against adjacent circuit boards to squeeze said circuit boards together during a plugging-in operation and to push said adjacent circuit boards apart during a pulling operation.

4. A tool for performing the functions of plugging in and unplugging an uppermost printed circuit board in a printed circuit board stack, said stack formed by a plurality of circuit boards spaced a predetermined distance apart, each circuit board having a common predetermined thickness and containing a keyhole-shaped aperture therethrough being a circular opening with a short connecting slot, comprising:

a hollow, cylindrical exterior part with a top end and a bottom end, said exterior part having a groove formed therein on an exterior side thereof spaced from said bottom end of said part a distance less than said circuit board spacing, a push rod comprising a push rod bar sized to be slidingly received in said exterior part to move along the longitudinal axis of said part and a push rod plate attached to one end of said push rod bar, said exterior part and said push rod plate having exterior diameters slightly smaller than said circular opening of said keyhole-shaped recess, but larger than the width of said short connecting slot, whereby, when a circuit board is to be plugged onto said circuit board stack, said push rod, with said push plate positioned below said bottom end of said cylindrical part, along with said cylindrical part is inserted into said opening in said circuit board to be plugged until said push plate is positioned below a next downwardly adjacent circuit board and said groove is aligned with said circuit board to be plugged, the tool is moved laterally into said slot and said cylindrical part is pushed downwardly while said push rod is held upwardly thereby causing a squeezing force between said two adjacent circuit boards resulting in a plug-in connection therebetween, and when said top circuit board is to be unplugged from said next downwardly adjacent circuit board, said push rod and said cylindrical part are inserted into said opening in said top circuit board until said push plate is positioned just above said next downwardly adjacent circuit board and said groove is aligned with said top circuit board the tool then being moved laterally into said slot and said exterior part being pulled upwardly while said push rod is held downwardly to cause a separation only between said two adjacent circuit boards.

* * * * *